US007653643B2

(12) United States Patent
Livshits

(10) Patent No.: US 7,653,643 B2
(45) Date of Patent: Jan. 26, 2010

(54) METHOD AND APPARATUS FOR COMPRESSING A DATA SET

(75) Inventor: Artem Y. Livshits, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 612 days.

(21) Appl. No.: 11/088,378

(22) Filed: Mar. 24, 2005

(65) Prior Publication Data

US 2006/0218170 A1    Sep. 28, 2006

(51) Int. Cl.
  G06F 7/00   (2006.01)
  G06F 12/00  (2006.01)
(52) U.S. Cl. .......................... 707/101; 707/4; 707/200
(58) Field of Classification Search ............... 707/1–10, 707/100–102, 104.1, 200; 375/240; 341/106
  See application file for complete search history.

(56) References Cited

U.S. PATENT DOCUMENTS

| | | | | | |
|---|---|---|---|---|---|
| 4,870,662 | A | * | 9/1989 | Lindbergh et al. | 375/240 |
| 5,001,478 | A | * | 3/1991 | Nagy | 341/67 |
| 5,274,805 | A | * | 12/1993 | Ferguson et al. | 707/7 |
| 5,424,732 | A | * | 6/1995 | Iyer et al. | 341/51 |
| 5,442,350 | A | * | 8/1995 | Iyer et al. | 341/51 |
| 5,585,793 | A | * | 12/1996 | Antoshenkov et al. | 341/51 |
| 5,717,860 | A | * | 2/1998 | Graber et al. | 709/227 |
| 5,831,558 | A | * | 11/1998 | Harvell | 341/106 |
| 5,933,104 | A | * | 8/1999 | Kimura | 341/87 |
| 6,073,135 | A | * | 6/2000 | Broder et al. | 707/100 |
| 6,327,699 | B1 | * | 12/2001 | Larus et al. | 717/128 |
| 6,611,832 | B1 | * | 8/2003 | van Lunteren | 707/3 |
| 6,687,688 | B1 | * | 2/2004 | Fujihara et al. | 707/3 |
| 6,718,325 | B1 | * | 4/2004 | Chandra | 707/6 |
| 7,072,880 | B2 | * | 7/2006 | Beesley | 707/2 |
| 7,260,583 | B2 | * | 8/2007 | Wiener et al. | 707/102 |
| 2001/0002483 | A1 | * | 5/2001 | Roberts | 712/210 |

* cited by examiner

Primary Examiner—Miranda Le
(74) Attorney, Agent, or Firm—Wolf, Greenfield & Sacks, P.C.

(57) ABSTRACT

A configuration management system that uses a data compression method to compress entries in a data set. An entry is selected as a prefix value and prefix compression of the data set is performed. The entry to serve as the prefix value is quickly selected using an iterative approach. In each iteration, subgroups of entries are formed from groups formed in prior iterations based on the values of characters at successive positions in the entries. The approach is readily implemented using data structures represented as lists.

14 Claims, 6 Drawing Sheets

METHOD AND APPARATUS FOR COMPRESSING A DATA SET

BACKGROUND OF INVENTION

1. Field of Invention

This invention relates generally to information management systems and more particularly to data compression in information management systems.

2. Description of the Related Art

Systems that store large amounts of information are used in many applications. For easily finding and retrieving information stored in such a system, an index is often formed of data stored in the system.

One application of an information management system is in a configuration management system. FIG. 1A shows a configuration management system 100. Configuration management system 100 includes a database 110. Database 110 is implemented in a computer storage system and stores multiple artifacts, here illustrated by artifacts $112_1, 112_2 \ldots 112_6$. The artifacts may, for example, be files holding source code in a source code management system.

Configuration management system 100 includes an index 120. Index 120 is also implemented in the computer storage system. The index includes two portions, an identifier portion 130 and a location portion 150. For each of the entries $122_1$, $122_2 \ldots 122_6$, a value is provided to identify a particular artifact in database 110 and describe where it is stored. For example, entry $122_5$ contains an identifier value 124 and a location value 126. Controller 170 is a computer that controls storage and retrieval of information from configuration management system 170.

In order to reduce the total amount of storage space required by configuration management system 100, it is known to compress data stored by the system. FIG. 1B illustrates an identifier portion 130', which may store the same information as identifier portion 130 (FIG. 1A). Identifier portion 130' stores information using a compression algorithm called "prefix compression." A prefix value 132 is stored, a portion of which is used to form the beginning part for all entries, $136_0, 136_1 \ldots 136_5$. In this example, the prefix value 132 is the value of a selected one of the uncompressed entries. In this example, the value in entry $122_2$ is selected for prefix value 132. Each entry in identifier 130' also includes a count value and a suffix value. For example, entry $136_6$ has a count value 134, here shown to be "9," and suffix value 138, here shown to be "al/bastio." The count value represents the number of characters in the prefix value 132 that are used to form the beginning part of the entry. The suffix value 138 represents the completion of the corresponding entry.

As can be seen in the examples of FIGS. 1A and 1B, the total number of characters needed to represent all of the entries when expressed as a count value and a suffix value is less than the total number of characters needed to represent all of the entries when their full values are stored in identifier portion 130. However, for compression to occur, the appropriate value must be selected as the prefix value 132. A simple way to determine an appropriate prefix value is to compute the compression that occurs when each entry $122_0, 122_1 \ldots 122_5$ is used as a prefix. Such an approach is, however, very computationally intensive. Because such an approach requires comparison of each entry in the data set to be compressed to every other entry in the data set, the computation required may be said to be on the order of $N^2$, where N is the number of entries in the data set to be compressed. An approach of this complexity is not well suited for use in systems where speed of operation is a concern, particularly for large data sets.

It would be desirable to have an improved method of compressing data.

SUMMARY OF INVENTION

The invention relates to a method of selecting a prefix value for compressing records in a database with reduced computational requirements. The method involves processing the entries in the data set on a character-by-character basis. An aggregated savings value is updated for each entry in the data set as each character is processed. The aggregated savings value for each entry is updated by adding a value representative of the number of other entries in the data set that have the same prefix portion, up to and including the character being processed, as that entry. The aggregated data values are used to select the entry that will yield the best compression of the data set if used as a prefix.

This algorithm may be efficiently implemented in a computer program that establishes data structures representing lists and processes them iteratively. These savings values are aggregated to compute an indication of the total compression achievable for each possible prefix value. The prefix value providing the most compression is selected as the prefix value for encoding the database.

In one aspect, the invention relates to a method of compressing a data set comprising a plurality of entries, each of the plurality of entries having a string, the string formed from characters, each character having a value and an ordered position in the string, with one character being the beginning of the string, such that each string has one or more prefix portions, each prefix portion containing a portion of the string having one or more characters at consecutively ordered positions in the string including the character at the beginning of the string. The method comprises determining a plurality of indicators, for each of the plurality of entries, representing the number of entries in the data set with a string having the same prefix portion as the sting of the entry, with each of the plurality of indicators for each of the plurality of entries determined for a prefix portion of the entry having a different number of characters; producing a plurality of aggregated indicators, each aggregated indicator representing a combination of the plurality of indicators determined for one of the plurality of entries; selecting an entry of the plurality of entries based on the aggregated indicators; and compressing the data set using the selected entry.

In another aspect, the invention relates to a method of compressing a data set comprising a plurality of entries, each of the plurality of entries having a string of characters associated therewith, with each character having a value and a position in the string. The method comprises forming a list of a plurality of list elements, with each list element having one of the plurality of entries associated therewith; forming a first plurality of sublists from the plurality of list elements with all the elements in each sublist of the first plurality of sublists having an entry associated therewith with a string having a character with the same value in a first position in the string; forming, for each sublist in at least a portion of the first plurality of sublists, a second plurality of sublists from the list elements in the sublist in the first plurality of sublists, with all the elements in each sublist of the second plurality of sublists having an entry associated therewith with a string having a character with the same value in a second position in the string; and for each of the plurality of entries, computing an indicator based at least in part on the number of elements in the sublist of the first plurality of sublists and the number of elements in the sublist of the second plurality of sublists in which the entry is associated.

In a further aspect, the invention relates to a configuration management system that has a database storing a plurality of artifacts; an index comprising a plurality of entries, each of the plurality of entries having a string of values associated therewith, with each value having a position in the string, and each entry identifying an artifact in the database; and a computer-readable medium storing computer executable instructions. The computer-executable instructions perform a method comprising: forming subgroups of entries from the plurality of entries in the index on the value at a first position of the string associated with each entry; forming further subgroups of entries from the entries in the subgroups based on the value at a second position in the string associated with each entry; for each of a plurality of entries, computing an indicator based on the number of entries in each subgroup to which the entry is a member; selecting an entry from the plurality of entries based on the indicators; and compressing the index using the selected entry.

DESCRIPTION OF THE PREFERRED EMBODIMENT

The invention may be used in connection with a configuration management system. The configuration management system includes an index of artifacts stored in a database. The index is compressed using prefix compression as known in the prior art. However, in contrast to prior art prefix compression approaches, the described embodiment selects a prefix with substantially less computation.

While described in connection with a configuration management system, the compression approach described herein is not so limited and may used in connection with any set of data entries that is to be compressed. Accordingly, compression of a set of entries in a data set is described. In the example embodiments used herein, each entry has a string of characters, with each character having a value. The values may be ASCII representations of letters, numbers and symbols such that the string of characters form file identifiers, such as is stored in the identifier portion 130 (FIG. 1A) of an index or may represent a file location, such as is stored in the location portion 150 (FIG. 1A) of an index. However there is no requirement that each "character" correspond to an ASCII representation or any other prescribed format.

Figure 2:
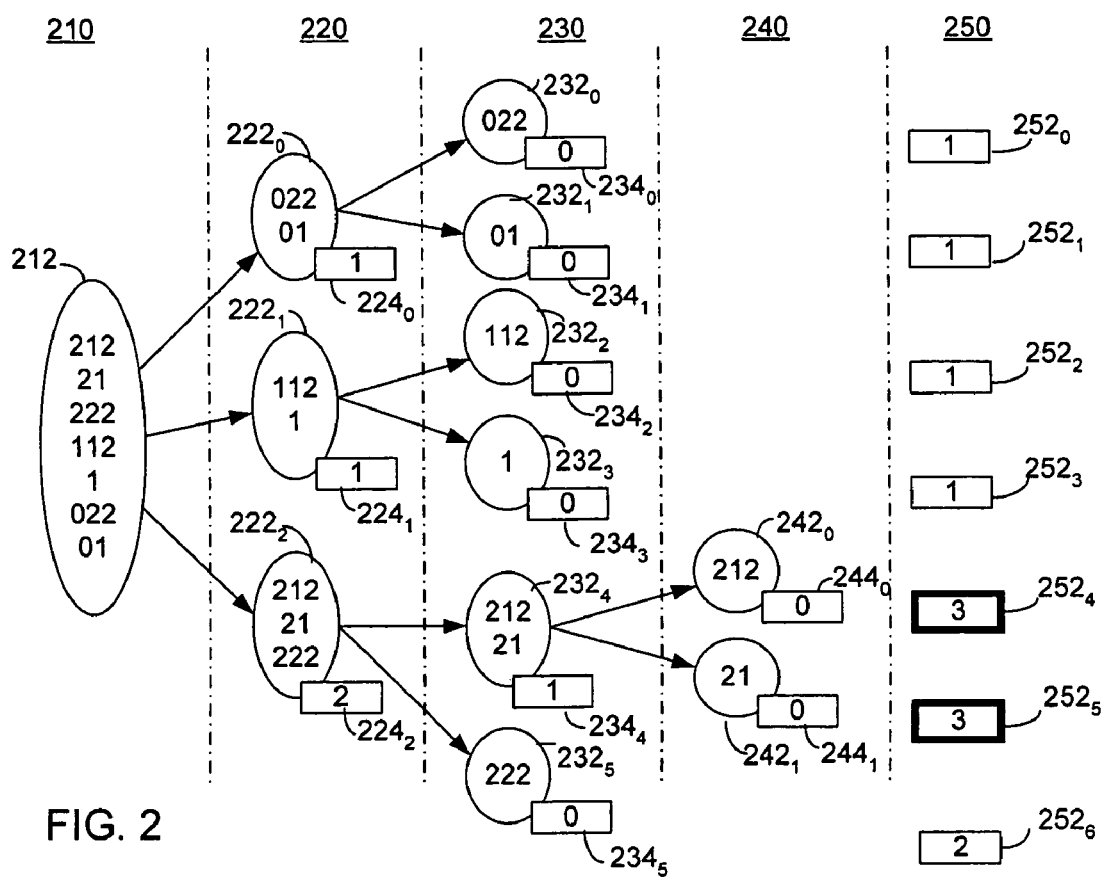
FIG. 2 is a sketch illustrating in conceptual form processing according to one embodiment of the invention.

FIG. 2 illustrates in conceptual form processing designed to select a prefix for use in compressing a set of data. According to the process depicted in FIG. 2, a group of entries from which a prefix value may be selected is processed in phases. In the example of FIG. 2, five phases are shown: phase 210, phase 220, phase 230, phase 240 and phase 250. As shown in FIG. 2, this processing results in a group 212 of entries being divided into successively smaller subgroups. Processing in this fashion will require a number of operations that is on the order of the number of entries in the group, which may be significantly less than processing using a number of operations on the order of $N^2$ as was used in the prior art.

In the example of FIG. 2, the initial group 212 includes seven entries. This number of entries is selected for ease of representation. An actual database may include many more than seven entries. Further, for ease of illustration, each entry is shown to be made up of a string of numeric characters. This limited range of character values is also for simplicity of illustration. For example, each entry may be made up of a string of characters, with each character being represented by a byte of data. Where a byte of data is used to represent each character, there may be 256 possible character values used to form entries in each group. Also, each entry is shown to have between one and three characters in the string. Entries represented by strings of any length may be processed.

In phase 210, the entries from which the prefix will be selected are represented as group 212. In phase 210, group 212 is divided into subgroups, with each entry in each subgroup having a first character with the same value. For example, all of the entries in group 212 that have the value "0" as the first character are assigned to subgroup $222_0$. Subgroup $222_1$ includes all of the entries in group 212 that have the value "1" for the first character. Subgroup $222_2$ contains all the entries in group 212 that have the value "2" for the first character.

Each of the subgroups is also assigned a value proportionate to the savings that can be achieved by using the character that was used as a criteria for forming the subgroup as a character in the prefix used in compressing the group of entries by prefix compression. For example, group $222_0$ has a savings value $224_0$ associated with it, representing the savings possible if the first character in the prefix has a value of "0." Savings value $224_0$ is assigned based on the number of members in the subgroup. In this example, the assigned savings value is computed by counting the number of entries in the subgroup and subtracting one. Such a value represents the number of records for which the selected character would not need to be stored in the suffix portion of the compressed file. One is subtracted from this count to represent the fact that the character would be stored once as part of the prefix.

Similarly, subgroup $222_1$ includes a savings value $224_1$. Subgroup $222_2$ contains a savings value $224_2$.

In phase 220, each of the subgroups is formed into one or more further subgroups. The subgroups are formed based on the value of the next character in each of the entries in the subgroup. For example, the subgroup $222_0$ was formed based on the value in the first character in each entry. Subgroup $222_0$ is divided into subgroups based on the second character in each entry. In this example, none of the entries in subgroup $222_0$ have the same value for their second character. Accordingly, subgroups $232_0$ and $232_1$ are formed, each with one entry.

Savings values $234_0$ and $234_1$ are likewise computed. Because each of the subgroups $232_0$ and $232_1$ contains one entry, the savings values $234_0$ and $234_1$ associated with these subgroups have a value of zero.

Likewise, subgroup $222_1$ is divided into two subgroups $232_2$ and $232_3$. The savings values $234_2$ and $234_3$ are likewise set to zero because each subgroup contains a single entry.

Subgroup $222_2$ is also divided into further subgroups based on the second character of each entry. Because two entries in subgroup $222_2$ have the value "1" as the second character, a subgroup $232_4$ is formed with those two entries. Subgroup $232_4$ has a savings value $234_4$ of one.

Subgroup $222_2$ also contains an entry with a value of "2" for the second character. This entry is assigned to subgroup $232_5$. Because subgroup $232_5$ has a single entry, the savings value $234_5$ associated with subgroup $232_5$ has a value of zero.

In phase 230, the subgroups $232_0$, $232_1$, $232_2$, $232_3$ and $232_5$ all have a single entry. Accordingly, they cannot be divided into further subgroups. Subgroup $232_4$ has multiple entries and can be divided into further subgroups.

In this example, subgroup $232_4$ is divided into further subgroups based on the value of the third character of each entry in the subgroup. In this case, none of the entries have a common character value in the third character position. Accordingly, subgroup $232_4$ is divided into subgroups $242_0$ and $242_1$, each of which has a single entry. Savings values are also assigned to subgroups $242_0$ and $242_1$. As in the prior phases, these savings values are assigned based on the number of entries in the subgroup. In this case, both subgroups receive savings values of zero.

In phase 240, once it is determined that no further subgroups may be formed, the savings value associated with each of the entries in the original group 212 may be aggregated to compute a total savings value for each entry. The total savings values $252_0 \ldots 252_6$ associated with each entry may be computed by adding the savings values for every subgroup containing that entry. For example, savings value $252_0$ is the savings value associated with the entry "022" in the initial group 212. Savings value 252 is the sum of the savings value associated with subgroup $232_0$ and subgroup $220_0$. As a further example, total savings value $252_4$ is the savings value associated with the entry "212".

Total savings value $252_4$ is computed as the sum of the savings values associated with subgroup $242_0$, $232_4$ and $222_2$.

In phase 250, once a total savings value has been computed for each entry in the original group 212, the entry with the largest savings value is selected as the prefix for compressing the entries in the original group 212 using prefix compression. In this example, total savings values $252_4$ and $252_5$ each have a value of "3", which is the maximum value. Where multiple entries are mapped to the maximum total savings value, any suitable method for selecting between them may be used. For example, the shorter of the two may be selected as the prefix value.

The process shown in FIG. 2 may be extended to process data sets having any number of entries. At each phase the subgroups formed in the prior phase are divided into further subgroups. Each successive phase forms subgroups based on the value of the character at the next position of the strings forming the entries in the subgroups formed in the prior phase. Phases are added until no subgroups can be divided into further subgroups.

Each subgroup formed in this way includes all the entries in the initial group 212 having the same prefix portion, up to and including the character at the position used in forming that subgroup. Each phase may be viewed as finding the number of entries that share a common prefix portion with successively longer prefix portions used at each phase.

Though the process illustrated in FIG. 2 may be implemented in any suitable fashion, the core of the process involves repetitively dividing groups into subgroups. Such a process may be readily implemented using a recursive algorithm.

Figure 3:
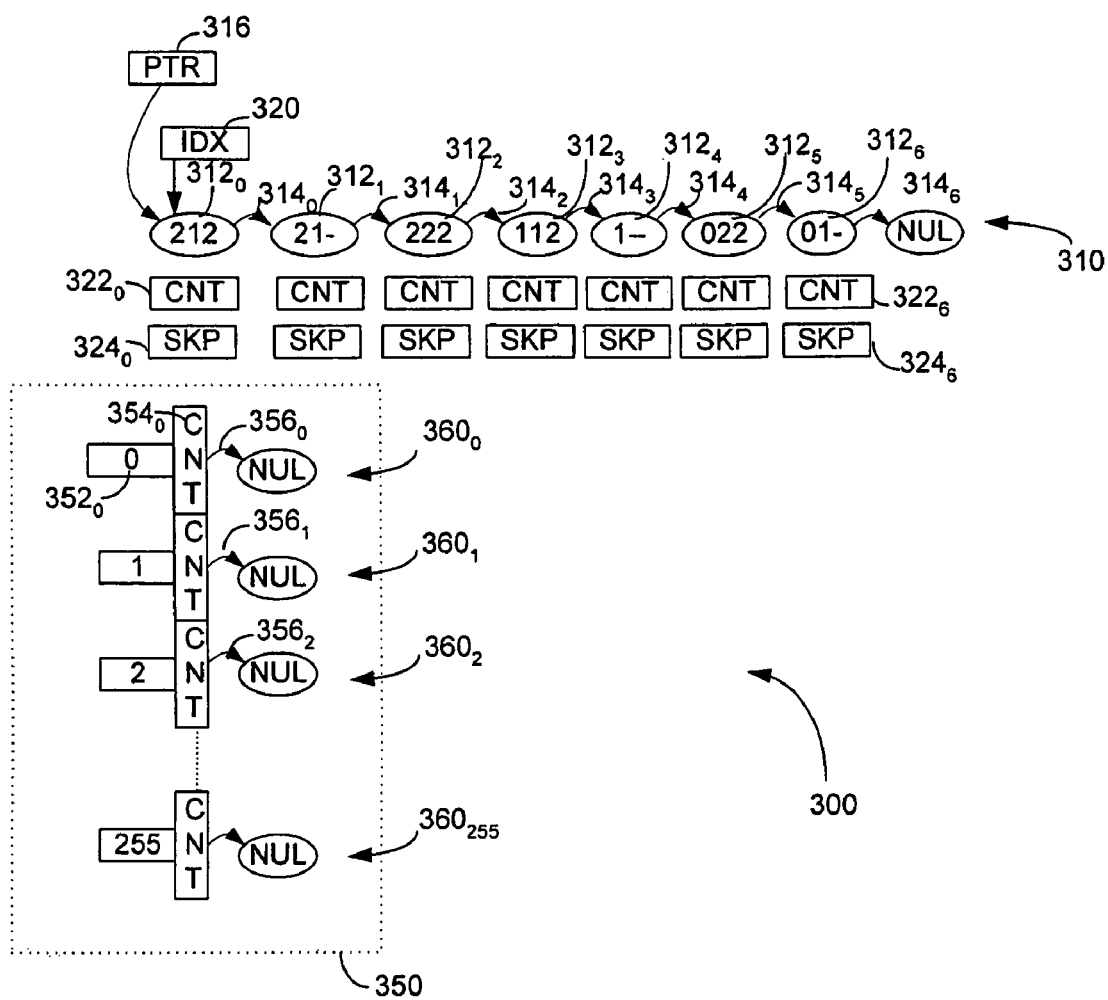
FIG. 3 is a sketch illustrating a data structure used in selecting a prefix to compress entries in a dataset according to one embodiment of the invention.

FIG. 3 shows an example of a data structure 300 that is well suited for use in such an algorithm. Data structure 300 may be constructed in computer readable and writable storage in a computer, such as controller 170 (FIG. 1). For processing according to the embodiment of FIG. 3, the entries from which a prefix may be selected are represented as a list 310. The list is made of a group of elements $312_0$, $312_1 \ldots 312_6$. Each element $312_0$, $312_1$, $\ldots 312_6$ includes a value. Here each element has a string value associated with it. The string contains an ordered grouping of the characters that make up one entry in the data set for which a prefix is to be selected.

In addition, each element in the list includes a next element pointer, such as next element pointer $314_0$, $314_1 \ldots 314_6$. In the example of FIG. 3, each of the next element pointers $314_0$, $314_1 \ldots 314_6$ is indicated by an arrow. In implementation in a computer data processor, a next element pointer may be implemented as a memory storage location containing a value identifying a specific list element to which the pointer points. Next element pointer $314_6$ from the last list element points to a NULL value. As depicted, the NULL value may be considered as a member of every list. However, no special storage space needs to be allocated for that element. Rather, an identifier, such as "−1", may be reserved for use with a NULL element. Any pointer having a value of "−1" would be treated as pointing to the NULL value.

As elements in the list are processed, pointer 316 keeps track of the element in the list being processed. In the illustration of FIG. 3, pointer 316 is initialized to point to the first element in the list. The specific list element pointed to by pointer 316, as well as any of the other pointers, may change as processing on the list is performed.

For keeping track of which character position of the elements in the list is being used to form subgroups, an index value 320 is provided. Index value 320 may, for example, be implemented as a value stored in a memory location. In the illustration of FIG. 3, index value 320 is shown initialized as pointing to the first character position of each element in the list.

The process according to the embodiment of FIG. 3 uses a series of savings count accumulators $322_0 \ldots 322_6$ (of which only $322_0$ and $322_6$ are numbered for simplicity). In the described embodiment, a total savings value (such as $252_0 \ldots 252_6$ in FIG. 2) is computed by accumulating values at each phase of the processing. Rather than storing count values at each phase as suggested by savings values $224_0$, $224_1 \ldots, 234_0, 234_1 \ldots, 244_0, 244_1 \ldots$, the embodiment of FIG. 3 uses a single memory location for each entry. As savings values are computed in each phase, each computed value is added to the appropriate storage location. In the embodiment of FIG. 3, savings count accumulators $322_0 \ldots 322_6$ are used to hold the sum of those values.

The embodiment of FIG. 3 also uses memory locations identified as skip list entries $324_0 \ldots 324_6$ (of which only $324_0$ and $324_6$ are labeled for simplicity). As illustrated in connection with FIG. 2, some entries become divided into subgroups for which no further processing is required. The skip list entries $324_0 \ldots 324_6$ are used in identifying those entries in list 310 for which further processing is required and those for which further processing is not.

The processing according to the embodiment of FIG. 3 also uses a bin data structure 350. As described in connection with FIG. 2, the entries from which a prefix value is selected are sorted into subgroups based on the value of a character at a specific location in the entry. At any phase of the processing, a number of subgroups may be formed, with the number being equal to the total number of possible values that could occupy each character position. In the embodiment illustrated in FIG. 3, each character is represented by a byte of data and therefore may have one of 256 values. Accordingly, there could be, at any phase of the processing, as many as 256 subgroups formed. Bin data structure 350 therefore includes 256 bin substructures $360_0$, $360_1 \ldots 360_{255}$. Each of the bin substructures $360_0$, $360_1, \ldots 360_{255}$ stores information from which a subgroup may be identified.

In the illustrated embodiment, each of the bin substructures $360_0$, $360_1 \ldots 360_{255}$ has the same structure. Taking bin substructure $360_0$ as illustrative, bin substructure $360_0$ is shown to have associated with it a character value $352_0$. Each of the bin substructures $360_0$, $360_1 \ldots 360_{255}$ has a unique character value associated with it. It is not, however, necessary that memory storage be allocated to store the character value. The character value may be inferred by the position of a particular bin substructure within the overall bin data structure 350.

Bin substructure $360_0$ also has associated with it a member count field $354_0$. Member count field $354_0$ may contain a count of the number of entries added to the subgroup associated with the character value $352_0$. The value in member count field $354_0$ may be updated as list 310 of entries is processed and the elements of list 310 are added to subgroups. Member count field $354_0$ could be, but need not be, a physical storage location in computer memory. The value in member count field could, for example, alternatively be determined by counting the number of entries in the subgroup associated with the character value $352_0$.

Members are assigned to the subgroup associated with character value $352_0$ by adjusting the pointers joining the elements in list 310. Pointer $356_0$, which is part of bin structure $360_0$, points to this sublist to associate it with character value $352_0$.

Pointers $356_1 \ldots 356_{255}$ may likewise be set to point to sublists formed from the elements in list 310. The sublist are built by processing the elements in list 310 one at a time.

Bin data structure 350 is initialized before any subgroups have been formed. In the first pass of sorting elements of list 310 into bins, each element in list 310 is processed starting with the first element pointed to by pointer 316. Based on the value of the character at the position in the string pointed to by the index value 320, the element is removed from list 310 and added to the list in the appropriate bin substructure $360_0$, $360_1 \ldots 360_{255}$. For example, in the initialized configuration shown in FIG. 3, pointer 316 points to element $312_0$. Index value 320 indicates that the first character in the string associated with this element should be used for sorting the list elements into subgroups. Because the first character in element $312_0$ has a value of "2", element $312_0$ is added to the list in bin substructure $360_2$. List element $312_0$ is added to that list by adjusting pointer $356_2$ to point to element $312_0$. Next element pointer $314_0$ associated with element $312_0$ is adjusted to point to the NULL value to signify that element $312_0$ is now the tail of the list associated with bin substructure $360_2$.

As part of this processing, pointer 316 is adjusted to point to the next element of the list 310, which is determined from the value of next element pointer $314_0$ before it is changed. The value in member count field $354_2$ is also incremented by one to indicate that an element has been added to the list in bin subgroup $360_2$.

The next element pointed to by pointer 316 may be processed in a similar manner. In this example, element $312_1$ is the next item in list 310. The value of the first character in element $312_1$ is also "2". Therefore, element $312_1$ is also added to the list in bin substructure $360_2$. To add element $312_1$ to the list, pointer $356_2$ is modified to point to element $312_1$. The next element pointer $314_1$ associated with element $312_1$ is adjusted to point to the list element previously pointed to by pointer $356_2$. Likewise, the member count field $354_2$ is again incremented. Pointer 316 is again adjusted to point to the next element in list 310 by taking on the value of next element pointer $314_1$ before it is changed. Processing continues in this fashion until all of the elements in list 310 are added to a list associated with the bin substructures $360_0$, $360_1 \ldots 360_{255}$.

Figure 4A:
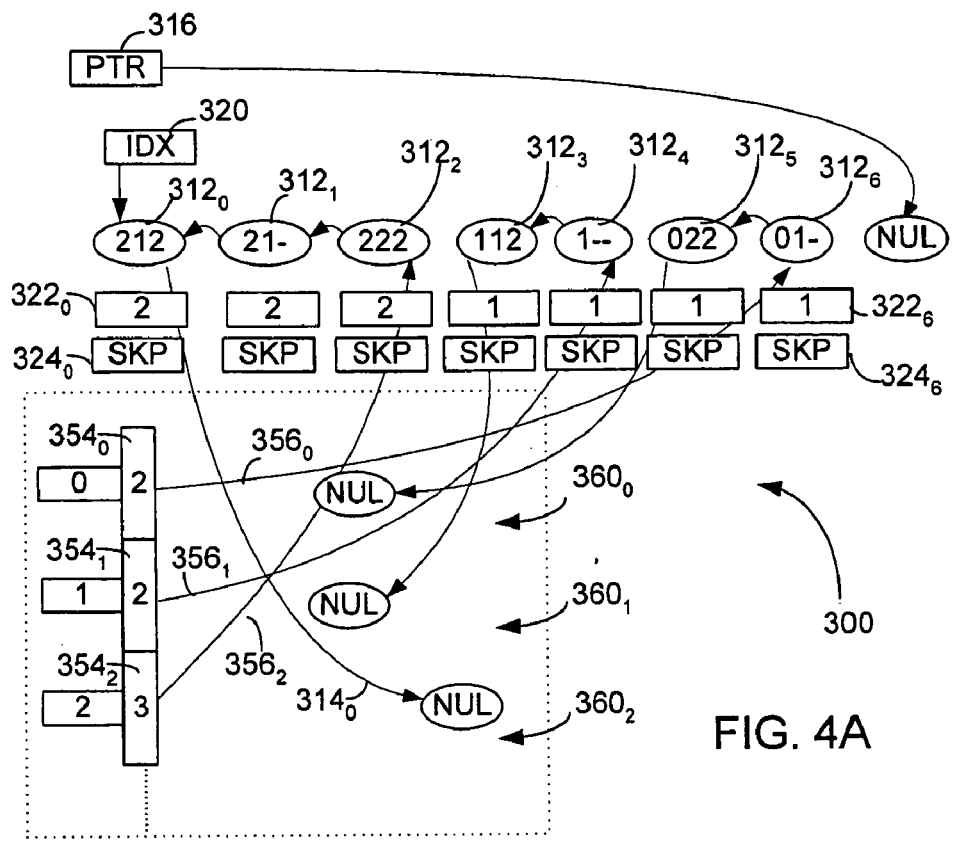
FIG. 4A is a sketch illustrating the data structure of FIG. 3 at a subsequent stage of processing.

FIG. 4A shows the state of the data structures 300 after one pass through list 310 is made. In the state illustrated by FIG. 4A, pointer 316 points to the NULL value, indicating that it has processed the entire list 310. Pointer $356_0$ in bin substructure $360_0$ points to a sublist containing elements $312_6$ and $312_5$. Pointer $356_1$, associated with bin substructure $360_1$, points to a list containing elements $312_4$ and $312_3$. Pointer $356_2$ associated with bin substructure $360_2$ points to a list containing elements $312_2$, $312_1$ and $312_0$.

Each of the member count fields $354_0$, $354_1$, $354_2 \ldots$ contains a value representing the number of entries in the list associated with the data substructure containing that member counter field.

The savings count accumulators $322_0$, $322_1 \ldots 322_6$ are each shown loaded with a value that is one less than the value in the member counter field associated with the bin to which the correlated list element has been assigned. For example, element $312_0$ has been assigned to the subgroup represented by bin substructure $360_2$. The member count field for bin substructure $360_2$ contains a value of three. Accordingly, the savings count accumulator $322_0$ associated with element $312_0$ contains a value of two (one less than the value contained in the member count field $354_2$). The values in the other savings count accumulators $322_1$, $322_2 \ldots 322_6$ are set in a similar fashion.

Figure 4B:
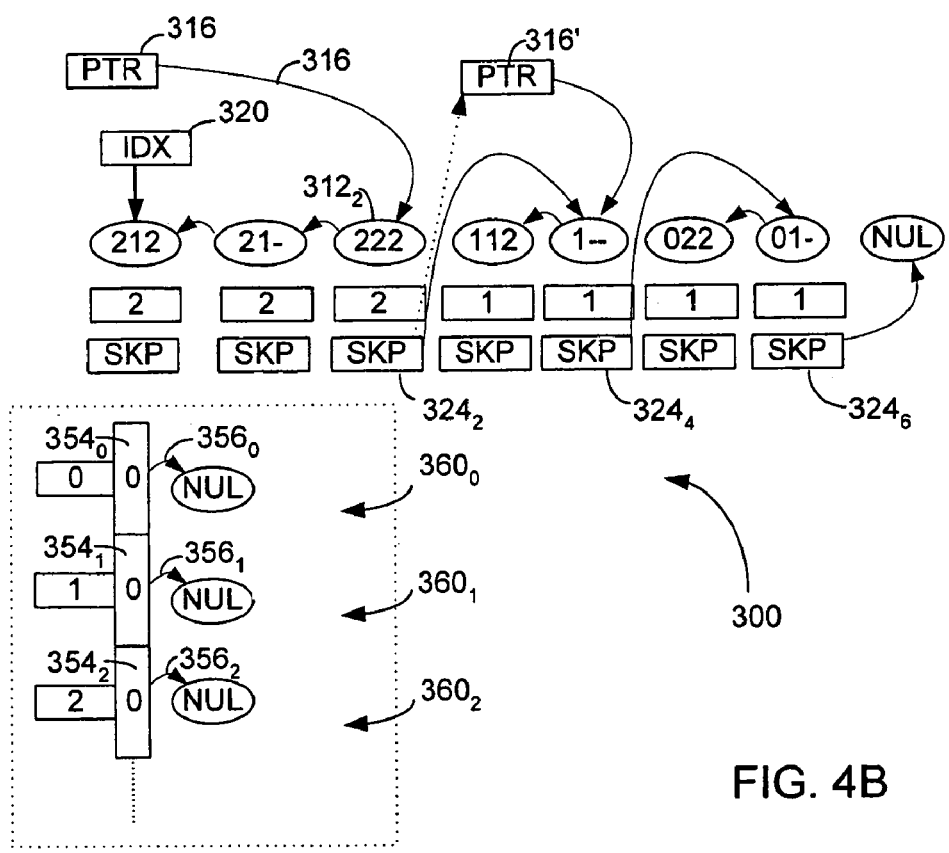
FIG. 4B is a sketch illustrating the data structure of FIG. 4A at a subsequent stage of processing.

Before bin data structure 350 is reset, sublists identified by pointers $356_0$, $356_1 \ldots 356_{225}$ are saved for further processing. FIG. 4B illustrates the state of data structure 300 as it is reset for the next pass.

Skip list entries $324_0 \ldots 324_6$ and pointer 316 are used to retain the lists associated with each of the bin substructures $360_0$, $360_1 \ldots 360_{255}$ having more than one member. To set the values of the skip list entries, each bin substructure is processed. The bin substructures may be processed in any order. In this example, they are processed in reverse order of character value so that they are processed from bin substructure $360_{255}$ to $360_0$. Pointer 316 is adjusted to point to the beginning of the sublist associated with the first bin data structure processed with a member count field greater than one. One of the skip list entries $324_0$, $324_1 \ldots 324_6$ is adjusted to point to the beginning of every other sublist having more than one entry.

In this example, the bin data substructure with the highest character value having a list with more than one entry is the list associated with bin substructure $360_2$. As shown in FIG. 4A, pointer $356_2$ points to element 3122. In FIG. 4B pointer 316 has been adjusted to point to this element. The skip list entry $324_2$ associated with element $312_2$ is used to store a pointer to the first element in the next sublist having more than one element. In the processing state illustrated in FIG. 4A, pointer $356_1$ points to the next sublist, which begins with element $312_4$. Accordingly, skip list element $324_2$ is adjusted to point to element $312_4$.

The next sublist to be retained is pointed to by pointer $356_0$. The first element in that sublist is element $312_6$. Accordingly the skip list entry $324_4$ associated with element $312_4$ is made to point to element $312_6$.

No further bin substructures have lists requiring further processing. Accordingly, the skip list element $324_6$ associated with element $312_6$ is adjusted to point to the NULL value.

Once the sublists created in the first phase are retained in the skip list entries $324_0 \ldots 324_6$, the sublists may each be processed, one after another, in the same way that list 310 was processed. Index value 320 is shown to point to the second character in the strings that form each of the list elements. The bin data substructure 350 is reset to the state as shown in FIG. 3. Pointer 316 points to the beginning of the first sublist to be processed.

As processing of the first sublist begins, the skip list entry $324_2$ associated with the list element that is pointed to by pointer 316 identifies the next sublist to be processed. Before this value is lost by changing the value in pointer 316 or modifying the value in skip list entry $324_2$ as a result of processing the first sublist, the value in skip list entry $324_2$ is saved in temporary pointer 316'.

Processing then begins first with the sublist pointed to by pointer 316. That list may then be processed in the same way that list 310 was processed. Bin data structure 350, having been restored to its initialization state, may be used for processing the sublist pointed to by pointer 316. At the end of processing that sublist, the member count fields $354_0$, $354_1, \ldots 354_{255}$ are added to the savings count accumulators $322_0, 322_1, \ldots 322_6$, respectively. New skip list entry values may be stored so that further processing may be performed on each sublist. The new skip list entries do not alter skip list entries for any sublists not yet processed and may be stored in the same memory locations used for skip list entries $324_0 \ldots 324_6$.

If processing of the first sublist results in the generation of more sublists with more than one element, those sublists may then be processed in the same way that the first sublist was processed.

Bin data structure 350 may be reset and used to process each sublist in turn. The savings count accumulators $322_0 \ldots 322_6$ are not reset, before each sublist is processed so that they will contain accumulated savings values. FIG. 2 illustrates that subgroups at successive phases are formed by sorting entries of a group based on the value of a character in a successive position in the entry. To implement this approach using list processing as depicted in FIGS. 4A and 4B, the index value 320 is incremented each time processing begins in a new phase.

Such a processing order lends itself to recursive processing as described below in connection with FIG. 5A and FIG. 5B. Such processing may be regarded as a depth first traversed of the "tree" of subgroups depicted in FIG. 2. However, an advantage of the described embodiment is that a total savings count associated with each element in the list is computed by accumulating savings counts as subgroups are formed. The order in which the subgroups are formed is therefore not a limitation in the invention.

Once the first sublist identified by pointer 316 in FIG. 4B is fully processed, processing proceeds with the next sublist. Bin data structure 350 may be reset and used in processing the next list. Temporary pointer 316' marks the first entry in the next sublist to be processed. List pointer 316 is set to the first element of that list, in this case, element $312_4$. Temporary pointer 316' is again set to "remember" the first entry in the next sublist to be processed. The value of temporary pointer 306' may be set based on the skiplist entry $324_4$ associated with that element. The selected sublist is processed element by element with pointer 316 being adjusted as each element is processed. At the end of processing that list, member count fields $354_0, 354_1 \ldots 354_{225}$ are added to the appropriate savings count accumulators $322_0, 322_1 \ldots 322_6$. The sublists formed that require further processing are again saved by adjusting the values in the skip list entries. Bin data structure 350 is again reset for use in processing for each of these sublists, but the savings count accumulators $322_0, 322_1 \ldots 322_6$ are not reset.

Each sublist, and any sublists generated by processing that sublist, are processed in this fashion. After processing of the sublist starting with entry $312_6$, an attempt to read the next sublist from skip list entry $324_6$ returns a pointer to the NULL value. Accordingly, when a skip list entry is found to contain a pointer to the NULL value, it may be determined that processing of all sublists has been completed in a particular pass. Once all of the sublists have been processed, the values in savings count accumulators $322_0, 322_1 \ldots 322_6$ represent the total saving if each entry in the data set is used as a prefix for compression. The entry associated with the largest value may be selected.

Figure 5A:
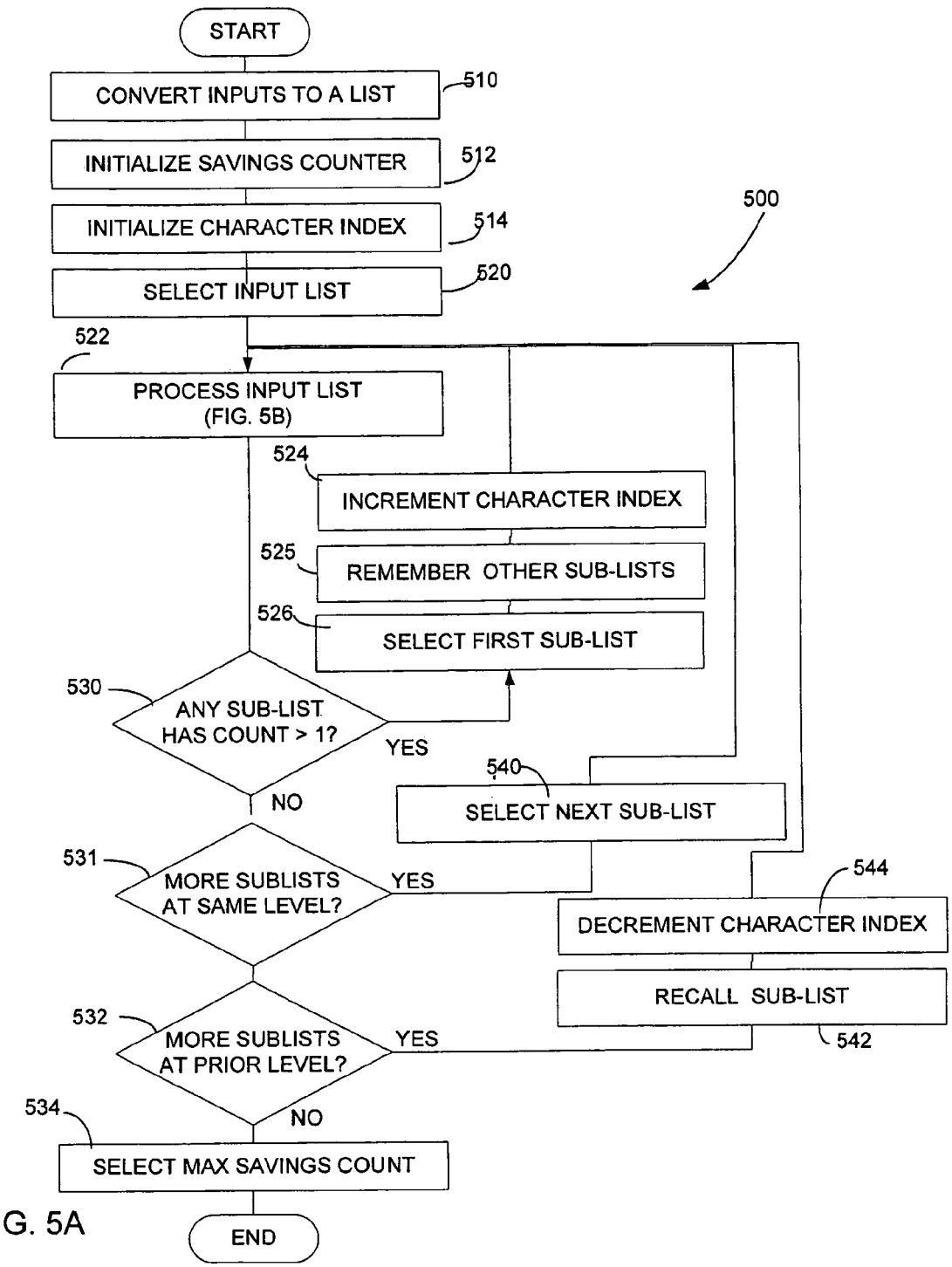
FIG. 5A is a flowchart illustrating processing according to one embodiment of the invention.

FIG. 5A illustrates a process 500 by which an entry in a set of entries may be selected as a prefix value. As illustrated in FIG. 3, each entry has a string of characters associated with it. Process 500 begins at process block 510. At process block 510, the set of elements is converted to a list, such as list 310 illustrated in FIG. 3. At process block 512 the savings counters $322_0, 322_1 \ldots 322_6$ are initialized. At process block 514 the character index 520 is initialized. The character index value is initialized to point to the first character in the string that represents any element of the test.

At process block 520 an input list is selected for processing. In the first iteration through the process, the original input list is selected for processing. In the example of FIG. 3, list 310 is selected at process block 520. A list may be selected for processing in any convenient way, such as adjusting pointer 316 to point to the first entry in the list.

Figure 5B:
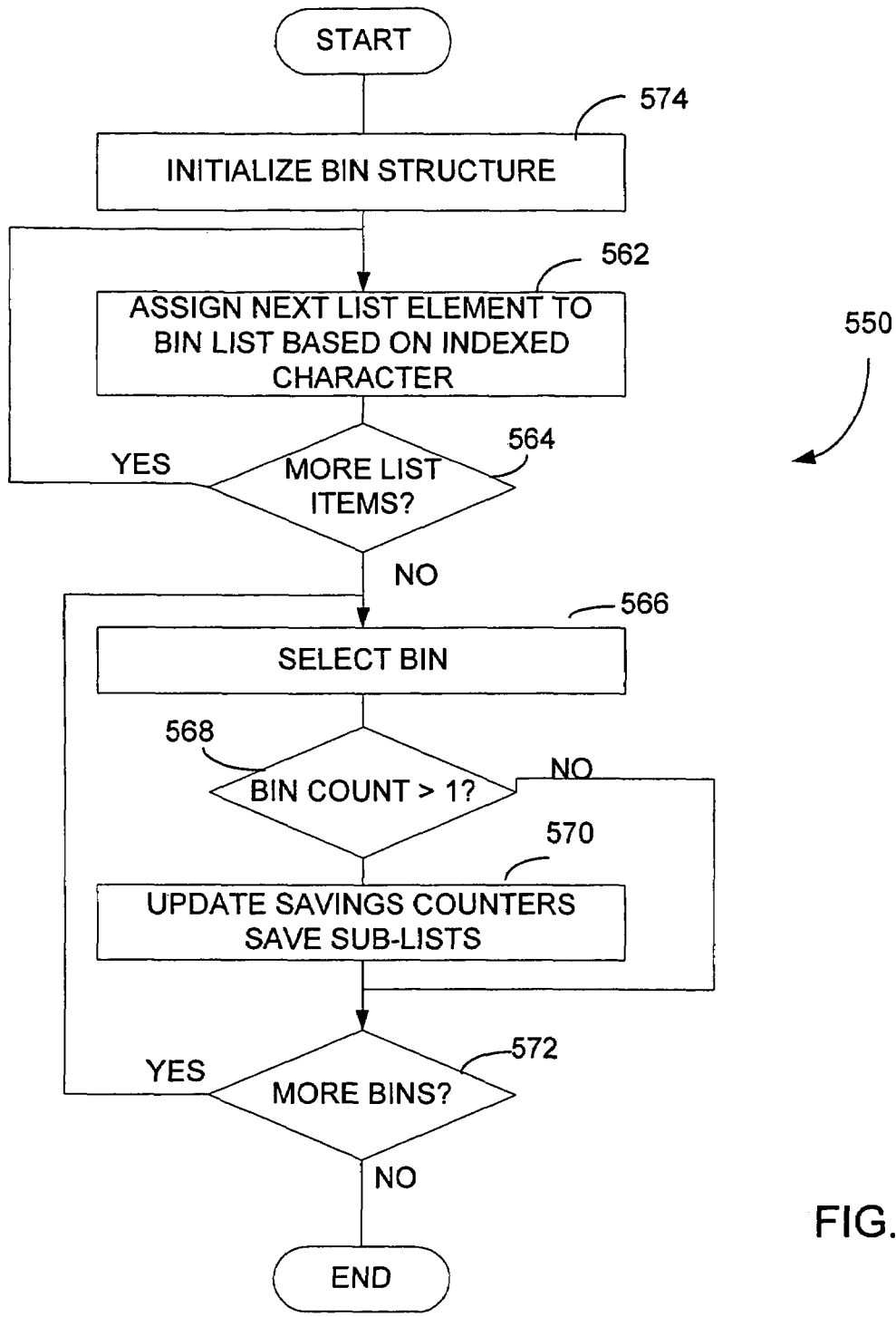
FIG. 5B is a flowchart illustrating processing performed in a subprocess of the processing illustrated in FIG. 5A.

The selected list is then processed according to the subprocess 550 shown in FIG. 5B. The processing by subprocess 550 (FIG. 5B) divides the list into sublists and adjusts the savings count accumulators $322_0, 322_1 \ldots 322_6$ based on the number of elements in the sublists to which each element is assigned.

Once the list has been processed according to subprocess 550 (FIG. 5B), a check is made at decision block 530 to determine whether the processing generated sublists that require further processing. In the illustrated embodiment, if any sublist contains more than one entry, that sublist is further processed.

If there are further sublists to process, the first of the sublists is selected at process block 526. The other sublists are "remembered" at process block 525. In the embodiment of FIG. 4B, each sublist is identified by one of the skip list entries $324_0 \ldots 324_6$, with the result that the sublists are linked in a chain so that once one sublist is processed, the next sublist to be processed can be identified by following a link in that chain to the next sublist. The sublists that have not been processed therefore can be "remembered" by storing a pointer to the first sublist in the chain formed by the skip list entries. For example, a pointer such as pointer 316' can be used to identify the next sublist in the chain.

Once a sublist is selected for further processing, the index value 320 is incremented so that the appropriate character in that sublist will be used to form any further sublists. Each sublist is divided into further sublists using the next character in the string of values associated with the list element. Incrementing index value 320 at process block 524 ensures that the appropriate character in the list elements is used to form further sublists.

Once the appropriate sublist is identified for further processing, that sublist is processed at block 522. As with processing on the initial list, processing at block 522 may divide the sublist into further sublists.

Following the creation of additional sublists, decision block 530 is again executed. If the sublists generated by processing at block 522 require further processing, the process blocks 526, 525 and 524 are again repeated to prepare for processing one of those sublists. The loop formed by process blocks 522, 526, 525 and 524 and decision block 530 is repeated until a sublist is processed and does not generate any sublists that require further processing. This condition is detected at decision block 530 and processing then passes to decision block 531.

At decision block 531, a check is made for other sublists that were generated from the processing step that generated the sublist just processed. In the processing shown in FIG. 4B, three sublists, starting with elements $312_2$, $312_4$, $312_6$, were formed in the same processing step. Once the first of these sublists is processed, the next of these sublists is processed. A similar pattern is followed at every level of processing.

Where further sublists at the same level as the sublist just processed remain for processing, the next sublist is selected at block 540. One simple way that the identification of sublists may be performed is through the use of a dynamically created data structure, such as a stack. When one sublists is selected from a group of sublists generated by processing a higher level list, a pointer to the next sublist in the group may be pushed on the stack. When processing of a sublist is completed, the pointer to the list element at the top of the stack may be popped from the stack and used to identify the next sublist to process.

Such a dynamically created data structure may be expressly structured as a stack. Alternatively, the processing shown in FIG. 5 may be implemented in a software program that includes a function that performs processing on each sublist. Such a function may be called recursively to process sublists created by processing another sublist. Each time the function is called, memory may be allocated for instantiation of the function. That memory may include storage space for a pointer to the next sublist to be processed, such as pointer 316'. Whenever execution returns to an instantiation of the function, the next sublist pointer stored in the memory associated with that instantiation will point to the next sublist to be processed.

The sublist selected at block 540 may then be processed in the same way as the first sublist selected. The processing will continue through the loop formed by process blocks 522, 526, 525 and 524 and decision block 530 until that sublist is fully processed. Once that sublist is processed, the loop formed by decision block 531 and process block 540 is repeated until all sublists formed at the same level are processed.

Once all of the sublists formed at the same level are processed, decision block 532 determines whether sublists were formed at a higher level. As above, levels may be implemented using a function that is recursively called to process every sublist. A function may be called recursively to process a sublist and generate further sublists. When the processing is completed for all the sublists created from one sublist, the instantiation of the function at that level will complete and processing will return to an instantiation of that same function instantiated to process the sublists formed at the next higher level. As described above, the function instantiated at each level may allocate memory to store the next sublist to be processed at that level. Thus, by returning from one instantiation of a function processing sublists to the instantiation that called it, the next sublist to be processed can be identified from the value stored in the memory allocated for the instantiation of the function to which execution returns.

Process block 542 selects a sublist at the next higher level. As indicated above, this sublist may be identified as a result of using a recursively called function. However, any suitable mechanism for identifying sublists for processing at different levels may be used.

At block 544, the index value 320 is decremented to indicate that processing is being performed at the next highest level. A character in the string at a position that depends on the level of the processing is used to sort the list elements into sublists. The process loops back to block 522 and the sublist selected at block 542 is processed in the same fashion as prior sublists.

Sublists are selected and processed in this fashion until all sublists at all levels have been fully processed. Once the processing of sublists is completed, the process continues at block 534. At block 534, the total savings counts for each entry in the list is determined. In the embodiment of FIG. 4A, these values are stored in the savings count accumulators $322_0 \ldots 322_6$. From this information, the entry that results in the greatest savings when used as a prefix may be identified.

FIG. 5B indicates a sub-process 550 used to process lists in process 500 (FIG. 5A). Sub-process 550 may be used to process list 310 or any of the sublists created from it.

Processing begins at process block 574. At process block 574, bin data structure 350 is initialized. For a bin data structure as represented in FIG. 3, initializing bin data structure 350 involves setting each of the member count fields $354_0$, $354_1 \ldots 354_{255}$ to zero. Each of the pointer $356_0$, $356_1 \ldots 356_{255}$ is also set to the NULL value.

In process block 562, the next item in the list being processed is assigned to a bin. In the described embodiment, there is one bin for each possible character value. Bins are implemented by creating sublists from the elements in the data set being processed. In the example of FIG. 3, each element being processed is stored as a list element. Sublists may be created by rearranging the pointers that link the elements in a list. Such a processing approach provides the advantage of not consuming additional memory to represent sublists. While desirable, particularly for large data sets, this implementation is not required. Any suitable method for forming subgroups of the elements in the data set being processed may be used.

At decision block 564, a determination is made whether there are further items in the list being processed. If further list elements remain to be processed, process block 562 is executed for the next list element. Process block 562 is repeatedly executed until all elements in the list are processed. Once all list elements are processed, processing proceeds to process block 566.

Starting at process block 566, the bins are processed to retain the information relating to the groupings formed. At process block 566, one of the bins is selected. The bins may be selected in any order for processing.

At decision block 568, a check is made whether the bin count for the selected bin is greater than one. If the bin count is not greater than one, the group of elements in that bin does not need to be further processed. Accordingly, processing proceeds to decision block 572. Alternatively, if the bin count is greater than one, the group of elements in that bin is further processed at process block 570.

At process block 570, the groupings formed are saved for further processing. In addition, savings counts associated with each bin are updated. The elements forming a group may be recorded as a sublist and the skip list entries may be used to identify each sublist. However, any suitable method may be used to retain this information. In the embodiment of FIG. 3, savings counts are updated by adding the number of elements assigned to the bin, minus one, to the savings count accumulator for each element in the list.

If more bins remain to be processed, processing loops back from decision block 572 to process block 566. Processing continues in this fashion until all of the bins have been processed.

Figures 1A, 1B:
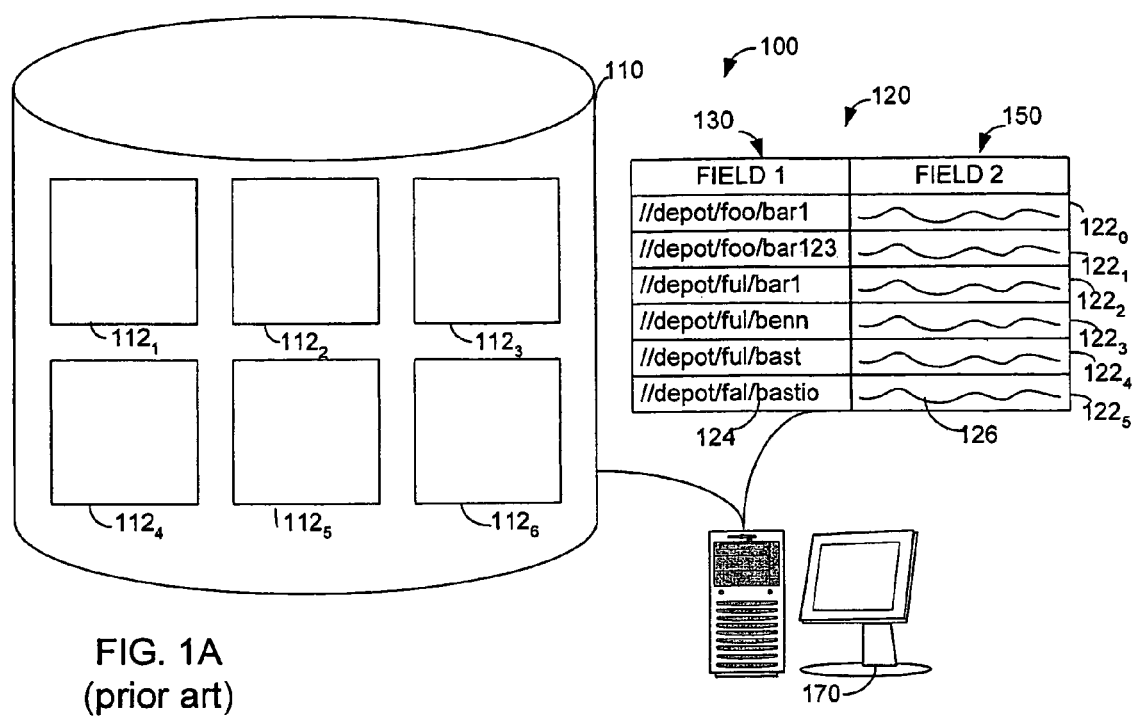
FIG. 1A is a sketch of a prior art configuration management system.
FIG. 1B is a sketch of a field in the database of the prior art configuration management system of FIG. 1A compressed according to prefix compression as known in the prior art.

Having thus described several aspects of at least one embodiment of this invention, it is to be appreciated various alterations, modifications, and improvements will readily occur to those skilled in the art. As one example, a prefix is selected to compress values in a field in an index for a configuration management system. If the index has multiple fields as shown in FIG. 1A, the same compression approach may be used on both fields or to compress any other values that may be treated as a data set.

As a further, example, the embodiments shown use a full entry from the original data set as a prefix for compression. The size of the prefix may be set to some predetermined number of character positions. In such an embodiment, processing could be stopped after subgroups have been formed based on values in that character position.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above. For example, the degenerative nature of the process in which one list is segregated into multiple sublists, each of which is separately processed makes the process amendable to implementation in a multiprocessing environment. Accordingly, any reference to the sequential nature of the process should be taken as a description of a logical flow of the algorithm and not a description of scheduling of tasks that may occur in a multiprocessor environment.

Also, the various methods or processes outlined herein may be coded as software that is executable on one or more processors that employ any one of a variety of operating systems or platforms. Additionally, such software may be written using any of a number of suitable programming languages and/or conventional programming or scripting tools, and also may be compiled as executable machine language code.

In this respect, one embodiment of the invention is directed to a computer readable medium (or multiple computer readable media) (e.g., a computer memory, one or more floppy discs, compact discs, optical discs, magnetic tapes, etc.) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The term "program" is used herein in a generic sense to refer to any type of computer code or set of instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiment.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Such alterations, modifications, and improvements are intended to be part of this disclosure, and are intended to be within the spirit and scope of the invention. Accordingly, the foregoing description and drawings are by way of example only.

What is claimed is:

1. A method of compressing a data set comprising a plurality of entries, each of the plurality of entries having a string of characters associated therewith, with each character having a value and a position in the string, the method comprising:

operating at least one processor to perform a method comprising:
 a) forming a list of a plurality of list elements, with each list element having the string of one of the plurality of entries associated therewith;
 b) forming a first plurality of sublists from the plurality of list elements with all the list elements in each sublist of the first plurality of sublists having a string associated therewith having a character with the same value in a first position in the string and each sublist of the first plurality of sublists having a number of said list elements associated therewith;
 c) forming, for each sublist in at least a portion of the first plurality of sublists, a second plurality of sublists from the list elements in the sublist in the first plurality of sublists, with all the list elements in each sublist of the second plurality of sublists having a string associated therewith having a character with the same value in a second position in the string and each sublist of the second plurality of sublists having a number of said list elements associated therewith;

d) for each of the plurality of entries:
   calculating an indicator based at least in part on the number of list elements in the sublist of the first plurality of sublists and the number of list elements in the sublist of the second plurality of sublists in which the entry is associated; and
   storing the indicator in computer memory;
e) selecting an entry of the plurality of entries as a prefix based on the calculated indicator; and
f) storing the selected prefix for use in compressing the data set.

2. The method of claim 1, wherein forming a list comprises establishing a data structure in a computer-readable and computer-writable medium having a plurality of sub-structures, with one sub-structure for each list element, each sub-structure having a field storing a representation of an entry in the data set and a field storing a pointer to another sub-structure.

3. The method of claim 2, wherein forming a first plurality of sublists comprises altering the pointers associated with selected ones of the sub-structures.

4. The method of claim 2, wherein:
a) the values of the characters in the each of the strings associated with the plurality of entries take on one of a predetermined number of values; and
b) the method additionally comprises establishing a second data structure in the computer-readable and computer-writable medium, the second data structure having the predetermined number of second sub-structures, each second sub-structure comprising a field storing a pointer.

5. The method of claim 4, wherein forming a first plurality of sublists comprises, for each sublist, altering the pointer in a second sub-structure to point to one of the sub-structures.

6. The method of claim 4, additionally comprising performing a plurality of iterations, with each iteration comprising forming a further plurality of sublists from each of the sublists in the prior iteration having more than one entry.

7. The method of claim 6, wherein performing a plurality of iterations comprises, during each of the iterations, using the sub-structures in the second data structure to store a pointer to the further plurality of sublists formed in the iteration.

8. The method of claim 6, wherein the computer memory comprises an accumulator and the calculating an indicator comprises updating the accumulator in each of the plurality of iterations.

9. A configuration management system comprising:
a) a database storing a plurality of artifacts;
b) an index comprising a plurality of entries, each of the plurality of entries having a string of characters associated therewith, with each character having a value and a position in the string, and each entry identifying an artifact in the database; and
c) a computer-readable storage medium storing computer executable instructions for performing a method comprising:
   i) forming subgroups containing entries from the plurality of entries in the index based on the value of a character at a first position of the string associated with each entry;
   ii) forming further subgroups containing entries from the entries in the subgroups based on the value of a character at a second position in the string associated with each entry;
   iii) for each of a plurality of entries:
      calculating an indicator based on a number of entries in each subgroup containing the entry; and
      storing the indicator in computer memory;
   iv) selecting an entry from the plurality of entries as a prefix based on the calculated indicators; and
   v) compressing the index using the selected entry.

10. The configuration management system of claim 9, wherein compressing the index using the selected entry comprises using prefix compression algorithm using the selected entry as a prefix.

11. The configuration management system of claim 9,
a) additionally comprising forming a list of a plurality of list elements, with each list element having one of the plurality of entries associated therewith; and
b) wherein, forming subgroups of entries comprises forming a plurality of sublists from the plurality of list elements with all the list elements in each sublist of the first plurality of sublists having an entry associated therewith with a string having a character with the same value in a first position in the string.

12. The configuration management system of claim 11, wherein forming further subgroups comprises forming, for at least a portion of the first plurality of sublists, a second plurality of sublists from the list elements in a sublist in the first plurality of sublists.

13. The configuration management system of claim 11, additionally comprises performing a plurality of iterations, and at each iteration forming a plurality of sublists from each of the plurality of sublists formed in the prior iteration having more than one entry.

14. A method of compressing a data set comprising a plurality of elements, each element having a string of characters associated therewith, each character in the string having a value and a position, the method comprising:
operating at least one processor to perform a method comprising:
a) forming a plurality of first groups from the plurality of elements, each first group in the plurality of first groups comprising elements from the plurality of elements having strings that share a common value of a first character in a first position in the string, the common value of the first character in the first position being unique, among the plurality of first groups, to the strings of the elements of said first group;
b) forming, for each first group of at least a portion of the plurality of first groups, a plurality of second groups from the plurality of elements in a respective first group, each second group in the plurality of second groups comprising elements from the plurality of elements in the respective first group having strings that share a common value of a second character in a second position in the string, the common value of the second character in the second position being unique, among the plurality of second groups associated with said respective first group, to the strings of the elements of said second group;
c) for each of the plurality of elements, calculating an indicator, the calculating comprising adding a number of elements in a first group of the plurality of first groups containing the element and a number of elements in a second group of the plurality of second groups containing the element;
d) selecting as a prefix the string associated with the element having the largest calculated indicator;
e) storing the selected prefix; and
f) compressing the data set using the selected prefix.

* * * * *